(12) United States Patent
Lopatinsky et al.

(10) Patent No.: US 7,237,599 B2
(45) Date of Patent: Jul. 3, 2007

(54) COOLER WITH BLOWER COMPRISING HEAT-EXCHANGING ELEMENTS

(75) Inventors: Edward Lopatinsky, San Diego, CA (US); Lev Fedoseyev, El Cajon, CA (US); Nil Askhatov, La Mesa, CA (US)

(73) Assignee: ROTYS Inc., San Diego, CA (US)

( * ) Notice: Subject to any disclaimer, the term of this patent is extended or adjusted under 35 U.S.C. 154(b) by 329 days.

(21) Appl. No.: 10/921,394

(22) Filed: Dec. 17, 2004

(65) Prior Publication Data

US 2005/0077027 A1    Apr. 14, 2005

Related U.S. Application Data

(60) Provisional application No. 60/498,953, filed on Aug. 30, 2003.

(51) Int. Cl.
*H05K 7/20* (2006.01)

(52) U.S. Cl. ............ 165/80.3; 165/122; 361/697

(58) Field of Classification Search .......... 165/80.3, 165/122; 36/697
See application file for complete search history.

(56) References Cited

U.S. PATENT DOCUMENTS

| | | | | |
|---|---|---|---|---|
| 5,597,034 A | * | 1/1997 | Barker et al. ............ 165/80.3 |
| 5,676,523 A | * | 10/1997 | Lee ............ 415/206 |
| 5,727,624 A | * | 3/1998 | Ko et al. ............ 165/121 |
| 5,816,319 A | * | 10/1998 | Kamekawa et al. ......... 165/121 |
| 5,978,219 A | * | 11/1999 | Lin ............ 361/697 |
| 5,995,367 A | * | 11/1999 | Smith et al. ............ 361/695 |
| 6,179,561 B1 | * | 1/2001 | Horng ............ 415/208.3 |
| 6,700,781 B2 | * | 3/2004 | Chia-Kuan et al. ......... 361/697 |
| 6,778,390 B2 | * | 8/2004 | Michael ............ 361/695 |
| 6,912,128 B2 | * | 6/2005 | Bird et al. ............ 361/695 |
| 6,981,542 B2 | * | 1/2006 | Lopatinsky et al. ....... 165/80.3 |
| 2003/0137047 A1 | * | 7/2003 | Lopatinsky et al. ........ 257/722 |
| 2004/0085731 A1 | * | 5/2004 | Lo et al. ............ 361/695 |
| 2004/0240178 A1 | * | 12/2004 | Kim et al. ............ 361/695 |
| 2005/0061477 A1 | * | 3/2005 | Mira ............ 165/80.3 |

* cited by examiner

*Primary Examiner*—Allen J. Flanigan

(57) ABSTRACT

A cooler for electronic components comprises a heatsink, a blower, and an electric drive with a rotor and a stator. The heatsink comprises heat-exchanging means, inflow and outflow openings, and a base providing thermal contact with said electronic components and said heat-exchanging means. The blower comprises a radial impeller, a casing with an inlet, and heat-exchanging elements that are located in an outflow path of the blower and are in the thermal contact with said heat-exchanging means. The outflow opening of the heatsink being coincided with said inlet of the blower thus cooling gas flows through said heat-exchanging means, said blower inlet, said radial impeller, and said heat-exchanging elements in a series way. The heatsink comprises a cover plate from the high heat conducting material with an outflow opening, and at least a part of said cover plate is made as a part of said casing. The side parts of said casing are made from the high heat conducting material and are in the thermal contact with said heat-exchanging means.

8 Claims, 5 Drawing Sheets

COOLER WITH BLOWER COMPRISING HEAT-EXCHANGING ELEMENTS

CROSS-REFERENCE TO RELATED APPLICATIONS

The present application claims the benefits of priority of the U.S. Provisional Patent Application Ser. No. 60/498,953 filed Aug. 30, 2003 for Edward Lopatinsky et al. the entire content of which is incorporated herein by reference.

BACKGROUND OF THE INVENTION

The present invention relates generally to cooling systems. More particularly, the present invention relates to cooling systems for regulating the temperature of electronic components of electronic devices. The present invention is particularly, but not exclusively, useful for cooling systems that regulate the temperature of electronic components of blade servers.

The regulation of the temperature of electronic components like processors due to heat generated inside the housing of an electronic device like a blade server is an important consideration during the design of an electronic device. Cooling is important because if left unchecked, heat can cause electronic devices to malfunction during use or lead to premature device failure. As improvements in processor speed occur, the amount of heat generated by the faster processors also increases. Additionally, improved processors require larger power supplies and auxiliary components that generate increased amounts of heat and require improved systems for heat removal.

Another factor that aggravates the need for improved heat removal cooling systems is the trend towards making computing devices such as blade servers smaller and especially thinner. The trend toward smaller and thinner electronic devices having larger, faster processors renders the traditional heat removal cooling systems inadequate for several reasons. First, smaller devices having faster processors result in an increased density of heat producing by electronic components leading to higher concentrations of heat. Second, a decreased amount of space is available for temperature regulating devices such as traditional heatsinks. Lastly, a decreased amount of space is available to create ventilation paths that pass through the heat-exchanging channels of the heatsink. Thus, traditional blower assemblies having an inlet from above the blower that ventilate the entire housing of the device are less effective or inapplicable in removing heat when used in smaller, thinner devices.

There are numerous designs of cooling systems for electronic devices that include a blower-assisted heatsink located directly at the electronic component. These conventional coolers had been using axial or radial blowers primarily. But, in spite of relatively high blower efficiency at regular size of axial and radial blowers, the blower efficiency drops dramatically when these blowers have been used for relatively small size cooling systems.

There are known devices of this type, for example, U.S. Pat. No. 6,196,300 "Heatsink". The device described in this US patent comprises an axial blower that produces a flow passing by heat-exchanging channels of the heatsink. The majority of inlets of the heat-exchanging channels are located just opposite of the axial blower's impeller with a certain number of said channels being placed radially in relation to the impeller axle.

The axial blower produces sufficient air pressure. However, due to the weak airflow in the area adjacent to the blower axle, the conditions for cooling of the central part of the heatsink located underneath a hub of the fan are unfavorable. In this case non-uniform cooling of the heatsink and electronic components will take place. It does not allow obtaining good efficiency for the heat-exchange process.

U.S. Pat. No. 5,838,066 "Miniaturized cooling fan type heatsink for semiconductor device" offers a design employing a radial blower that is installed on the side of the heatsink. In one particular embodiment of this invention the cooling airflow passes by rectilinear means through the heat-exchanging channels of the heatsink.

However, placement of a radial blower to the side of the heatsink increases the device size and reduces its effectiveness because the location of the radial blower leads to insufficient coordination between the direction of channel inlets and direction of airflow supplied from the blower.

An invention described in the patent of Japan No. 8-195, 456 "Cooler for electronic apparatus" comprises heatsink, a radial blower enclosed in the casing and an electric drive located out of the casing. The blower is installed above the heat-exchanging channels of the heatsink. Another heatsink surface is made so that the possibility of thermal contact with an electronic device is provided for. The inlet of the radial blower faces the heatsink. The radial blower produces an airflow that passes by the heat-exchanging channels and then gets drawn into the inlet of said blower.

It is also known a cooler for electronic components described on: http://www.dynatron-corp.com/products/cpu-cooler/1USolution.asp?page=1U, -DC1U-B04 for AMD K8 Opteron Socket or DC1U-B01 for AMD Socket A/462, INTEL Socket 370. This cooler is the same like the cooler according to the above Japanese Patent but has only one difference—the electric drive being located inside the blower and surrounded by the impeller thus decreasing the thickness of the cooler but the same time decreasing the blower efficiency.

The main problem of all coolers with a radial blower-assisted heatsink—not enough thermal efficiency of the cooler with fixed overall sizes because of not enough heat-exchanging surface.

Therefore, it would be generally desirable to provide an apparatus that overcomes this problem associated with a cooler comprising a blower-assisted heatsink and has higher thermal efficiency without the need to increase the size of the cooler.

SUMMARY OF THE INVENTION

According to the present invention a cooler for electronic components comprises a heatsink, a blower, and an electric drive with a rotor and a stator. The heatsink comprises heat-exchanging means, inflow and outflow openings, and a base providing thermal contact with said electronic components and said heat-exchanging means. The blower comprises a radial impeller and a casing with an inlet. The outflow opening of the heatsink being coincided with said inlet of the blower thus cooling gas flows through said heat-exchanging means, said blower inlet, said radial impeller, and an outflow path of the blower in a series way.

The general idea of the claimed invention is to increase the heat-exchanging surface without increasing the overall sizes of the cooler. In order to achieve these objectives, the blower comprises heat-exchanging elements that are located in an outflow path of the blower and are in the thermal contact with said heat-exchanging means of the heatsink so that cooling gas after the impeller flows through said heat-exchanging elements. According to the preferred embodiment the heatsink comprises a cover plate made from the high heat conducting material with an outflow opening, and at least a part of said cover plate is made as a part of said casing of the blower (that covers the blower from the side of the heatsink) so that said outflow opening of the heatsink serves as said inlet of the blower. In this case said heat-exchanging elements are located on the cover plate of the heatsink (in physical contact with said cover plate). Said heat-exchanging elements can be made as fins or/and pins. Because of having additional heat-exchanging elements this cooler has higher thermal efficiency than all known coolers. Said heat-exchanging elements are located in the outflow path of the blower so they do not increase the thickness and other overall dimensions of the cooler. The higher thermal efficiency allows to provide the better cooling or to decrease the size of the cooler.

According to the further embodiment when the casing of the blower has the side parts—these parts are made from the high heat conducting material and are in the thermal contact with the heat-exchanging means of the heatsink so they serve as heat-exchanging elements of the blower. In this case blower has two types of heat-exchanging elements—the heat-exchanging elements made as fins or/and pins located in the outflow path of the blower and said side parts of the casing. The combination of all said elements provides higher thermal efficiency of the cooler. When the casing of the blower does not have those parts and is open to the ambient air from all sides, said heat-exchanging elements are located on all sides around the impeller of the blower, in the preferred embodiment—on all space between said impeller and edges of the heatsink. In this case the cooler has the highest thermal efficiency.

DETAILED DESCRIPTION OF THE INVENTION

Claimed invention will be described in detail below with reference to the accompanying drawings.

Figure 1:
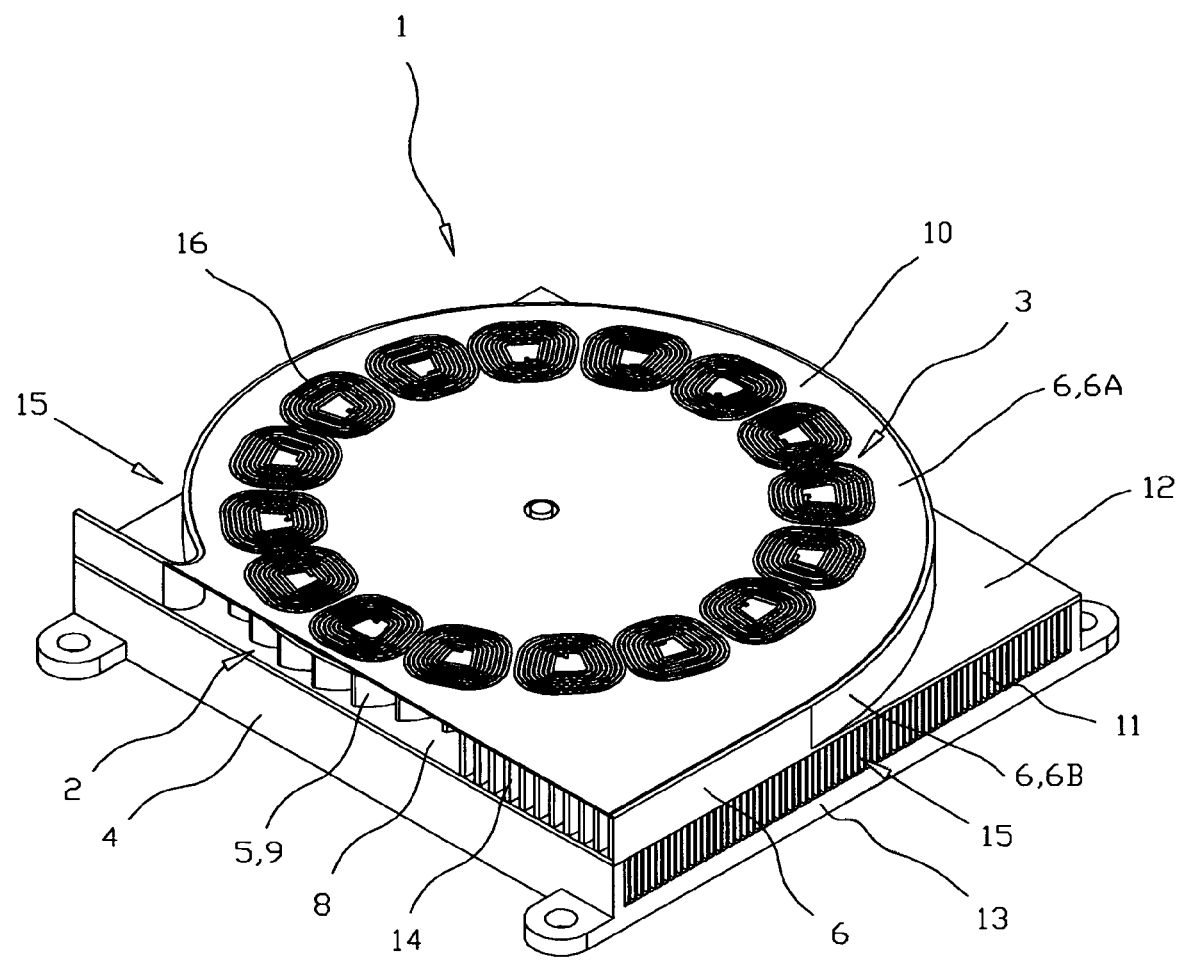
FIG. 1 is a perspective view showing the first embodiment of the cooler for electronic components by the present invention.
Figure 2:
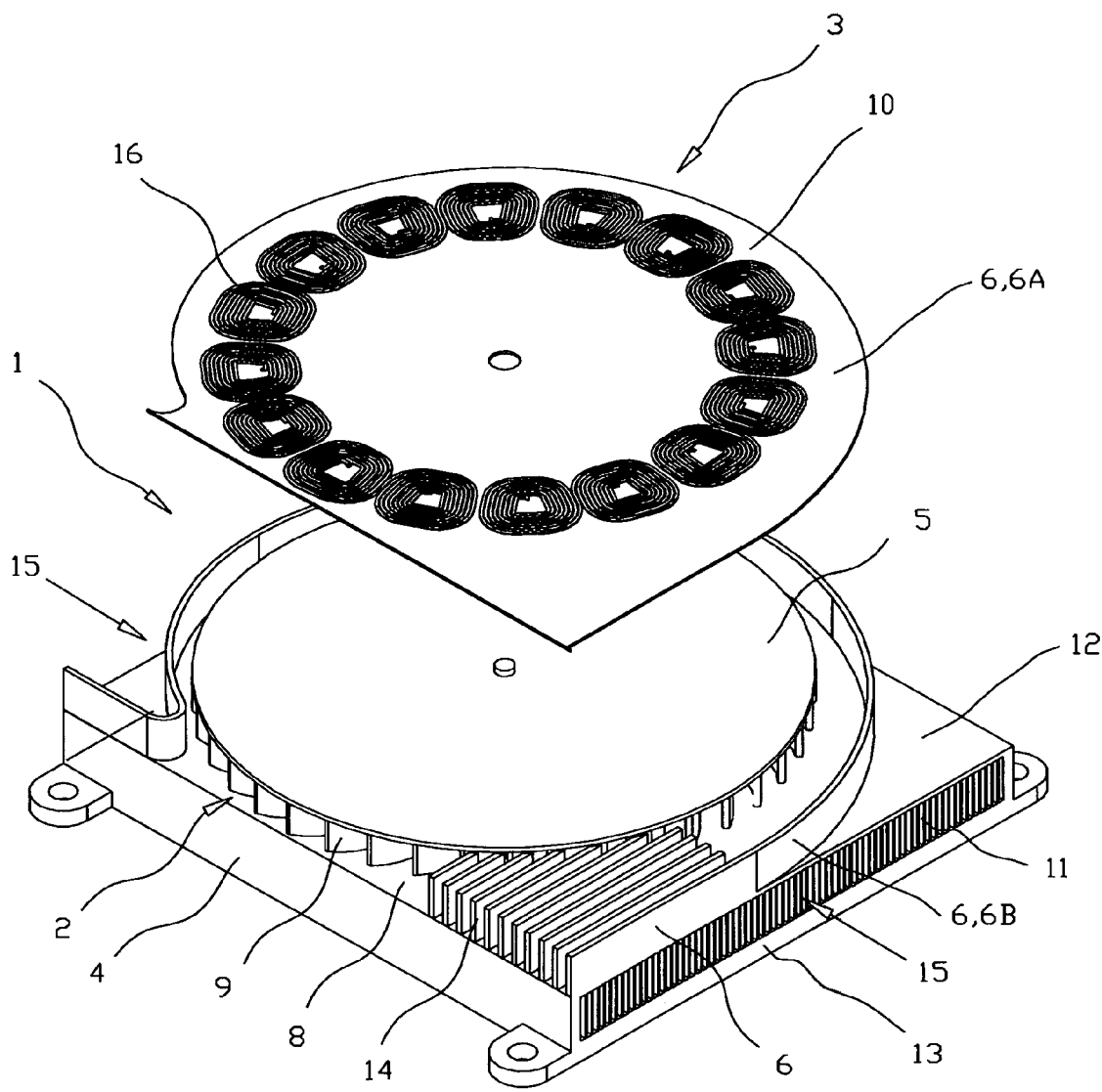
FIG. 2 is an exploded view showing said cooler when only a stator is on the distance from another parts of the cooler.
Figure 3:
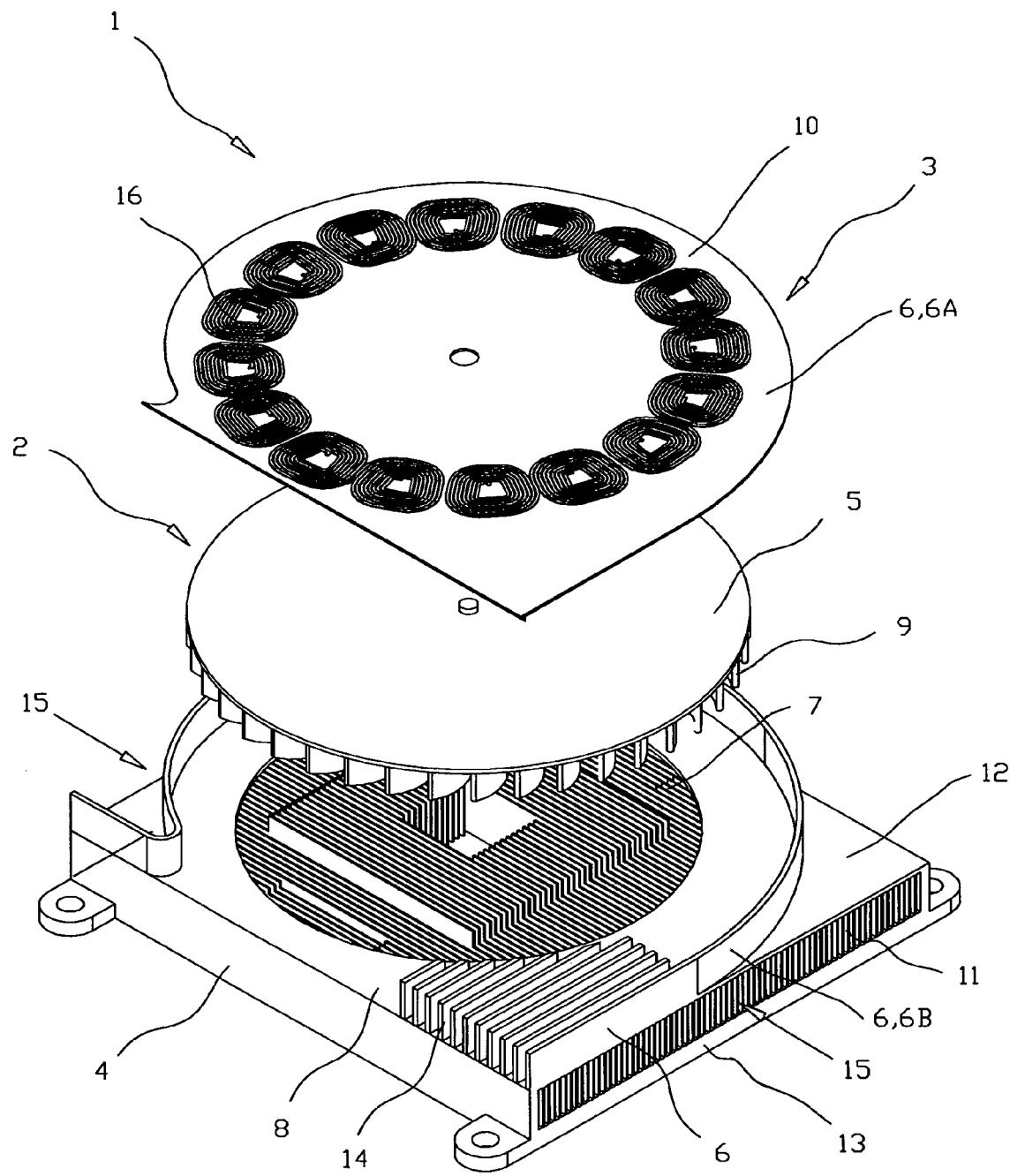
FIG. 3 is an exploded view showing said cooler when a stator and a rotor are on the distance from another parts of the cooler.
Figure 4:
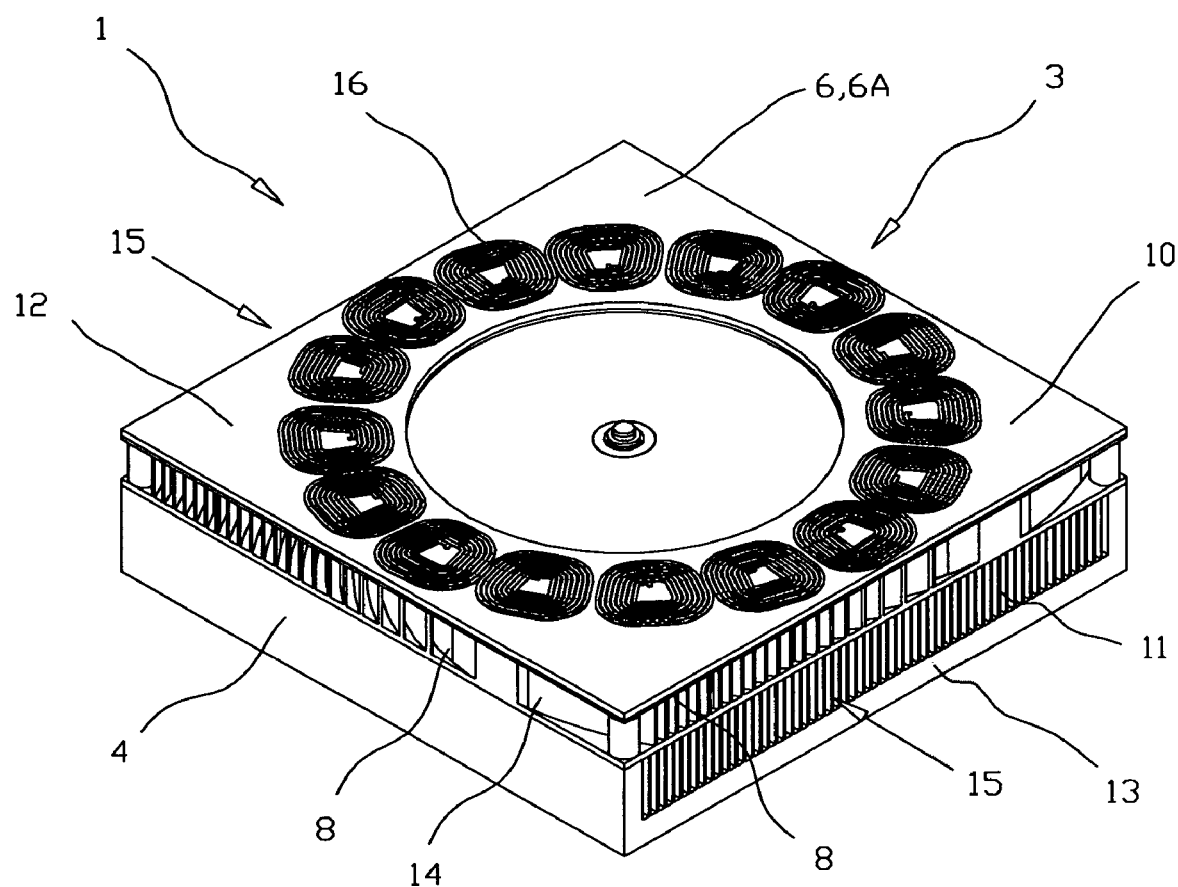
FIG. 4 is a perspective view showing the second embodiment of the cooler for electronic components.
Figure 5:
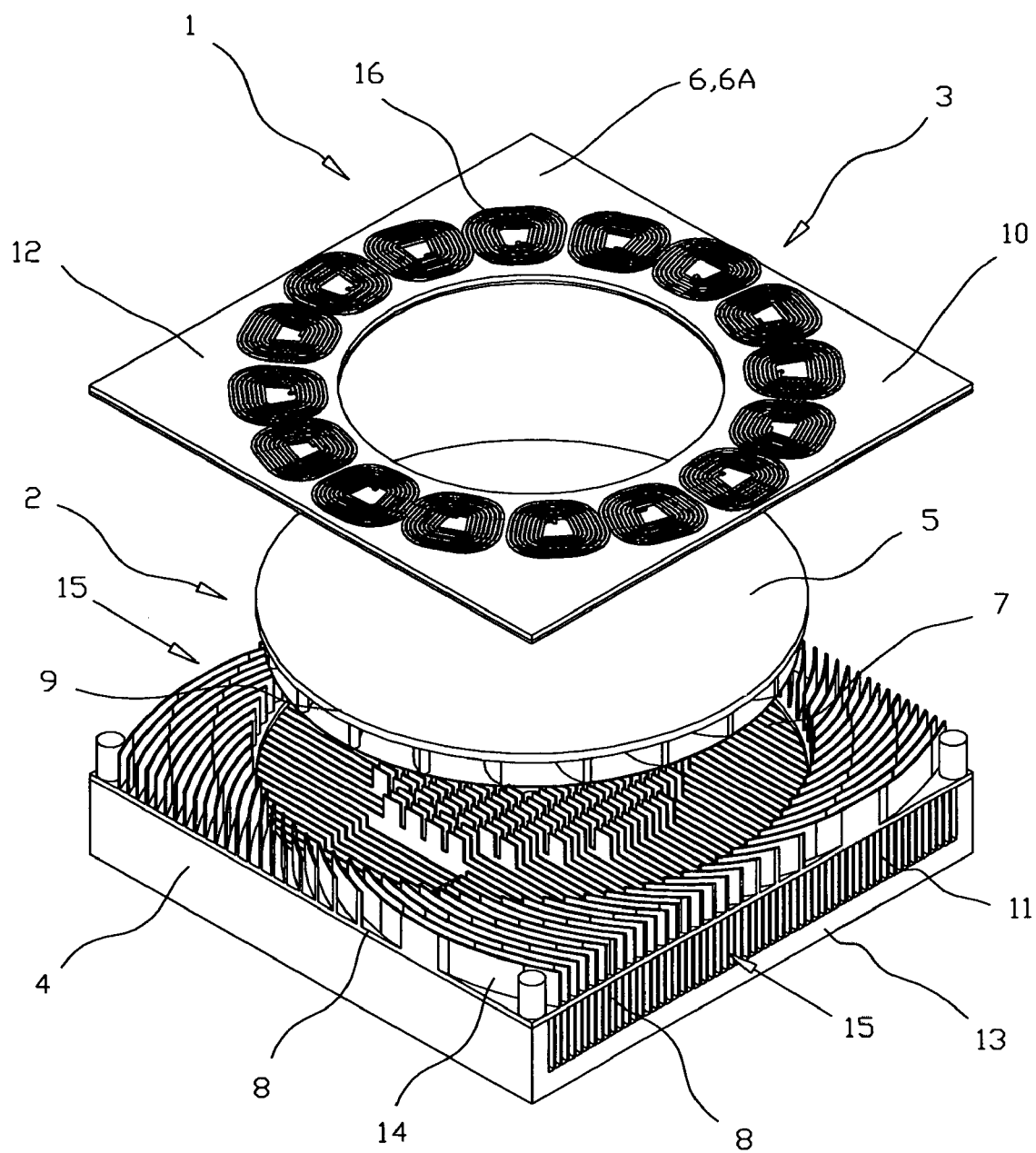
FIG. 5 is an exploded view showing the second embodiment of said cooler.

The cooler 1 (FIGS. 1-5) for electronic components (not shown) comprises a blower 2 with an electric drive 3 and a heatsink 4. The blower 2 comprises a radial impeller 5 and a casing 6 with an inlet 7 and an outlet 8 of the blower 2. The radial impeller 5 comprises magnetic blades 9 so it serves as a magnetic rotor of the electric drive 3. The electric drive 3 has a stator 10 made as printed circuit board and as a part 6A of the casing 6 of the blower 2. The heatsink 4 comprises heat-exchanging means 11, a cover plate 12 made from the high heat conducting material and a base 13 providing the thermal contact with said electronic component and with the heat-exchanging means 11. The blower 2 has heat-exchanging elements 14 that are made as fins located in an outflow path of the blower 2 and are in the contact with said cover plate 12 of the heatsink 4 and, accordingly, in the thermal contact with the heat-exchanging means 11 of the heatsink 4. At least a central part 12A of the cover plate 12 is made as a part of the casing 6 of the blower 2 so that an outflow opening of the cover plate 12 serves as the inlet 7 of the blower 2, thus inside space of the blower 2 is open to the heatsink 4 and cooling gas flows from the ambient air through the inflow openings 15 of the heatsink 4, the heat-exchanging means 11, the blower inlet 7, the radial impeller 5 and the heat-exchanging elements 14 to the ambient air in a series way.

In the first embodiment of the invention (FIGS. 1-3) the side parts 6B of the casing 6 of the blower 2 are made from the high heat conducting material, for example, from aluminum, and are in the physical contact with the cover plate 12 of the heatsink 4. So these parts 6B are in the thermal contact with said cover plate 12 and with said heat-exchanging means 11 of the heatsink 4; thus said parts 6B of the casing 6 of the blower 2 are at the same time the heat-exchanging elements. The cooler 1 comprises heat-exchanging elements 14 that are located in the outflow path of the blower 2 near its outlet 8 and are in the contact with the cover plate 12 of the heatsink 4 and, accordingly, in the thermal contact with heat-exchanging means 11 of the heatsink 4. The heat-exchanging elements 14 are made as fins. They could be made also as pins.

In the second embodiment of the invention (FIGS. 4, 5) the casing 6 of the blower 2 does not comprise side parts but only part 6A, which is the same time the stator 10, and the part that is formed by cover plate 12 of the heatsink 4. It is possible when the cooling gas can go to the all sides of the blower 2. In this case the blower 2 is open to the ambient air from all sides, and heat-exchanging elements 14 are located on all sides around the impeller 5 of the blower 2 in the contact with the cover plate 12 of the heatsink 4 and, accordingly, in the thermal contact with the heat-exchanging means 11 of the heatsink 4. These heat-exchanging elements 14 are located on all space between the impeller 5 and the edges of the heatsink 4 so that this space is the same time outflow path of the blower 2.

The operation of the electric drive 3 in the present invention is substantially similar to the operation as was described in the U.S. patent application Ser. No. 10/183,032 for BRUSHLESS DC ELECTRIC MOTOR for the same Assignee, which is hereby incorporated by this reference for all that disclosed therein.

The cooler 1 for electronic components operates in the following way. When electric power is supplied to the stator 10 (its winding 16) of the electric drive 3, alternate electromagnetic fields are created. These electromagnetic fields interact with a magnetic field created by the magnetic blades 9 of the radial impeller 5 which serve as the magnetic rotor of the electric drive 3. As a result the impeller 5 is rotated. Cooling gas starts moving and flows through heat-exchanging means 11 of the heatsink 4. Heat generated by electronic components transfers to the base 13 due its thermal contact and spread to the heat-exchanging means 11. As cooling gas flows through the heat-exchanging means 11 the intensive process of heat exchange takes place. This process continues when cooling gas flows through the blower 2 and the heat-exchanging elements 14 in the outflow path of the blower 2 near its outlet (outlets) 8. The heat-exchanging elements 14 and the parts 6B of the casing 6 of the blower 2 (if the casing 6 has these parts) are important participants of the heat-exchanging process.

The total amount of heat taken away by the gas going in a series way through the heat-exchanging means 11 of the heatsink 4, the inlet 7 of the blower 2, the blower 2, the heat-exchanging elements 14 of the blower 2, and the outlet 8 of the blower to the ambient air depends on the temperature difference between cooling gas and heat-exchanging means, the surface coefficient of heat transfer and the heat-exchanging surface including the heat-exchanging means 11 of the heatsink 4, the parts 6B of the casing 6 of the blower 2 and the heat-exchanging elements 14. The common heat-exchanging surface of this cooler is much more than in all known coolers because it additionally comprises the heat-exchanging elements 14 and, when it is possible, the parts 6B of the casing 6.

As a result of the increasing of the heat-exchanging surface, the cooler by present invention has the higher thermal efficiency in comparison with known coolers so it can provide the better cooling or/and it can be made smaller.

We claim:

1. A cooler for electronic components comprising a heatsink, a radial blower, and an electric drive with a rotor and a flat stator, wherein:
(i) said heatsink comprises heat-exchanging means spaced between and thermally connected with a base and a cover plate thus form inflow openings from side parts of said heatsink;
(ii) said blower spaced above said heatsink and comprises a casing with an inlet and an outlet, and a radial impeller with magnetic means thus said radial impeller serves as said rotor;
(iii) said heatsink further comprises heat-exchanging elements spaced above and thermally connected with said cover plate;
(iv) said radial impeller is at least partially surrounded by said heat-exchanging elements;
(v) said cover plate has an outflow opening coincided with said inlet thus said cover plate serves as a part of said casing and cooling gas flows through said inflow openings, said heat-exchanging means, said inlet, said radial impeller, and said heat-exchanging elements in a series way.

2. The cooler as claimed in claim 1, wherein said heat-exchanging means are made as fins structure.

3. The cooler as claimed in claim 1, wherein said magnetic means are made as magnetic blades.

4. The cooler as claimed in claim 1, wherein said heat-exchanging elements are made as fins spaced apart at equal space and directed along gas flow.

5. The cooler as claimed in claim 1, wherein said heat-exchanging elements are made as a whole with said cover plate.

6. The cooler as claimed in claim 1, wherein said flat stator coincided with a top side of said casing thus said heat-exchanging elements are covered from top by said flat stator.

7. The cooler as claimed in claim 6, wherein said casing further comprises a side part having a volute shape and said fins are surrounded by said side part.

8. The cooler as claimed in claim 6, wherein said radial impeller is surrounded by said fins located along the whole top surface of said cover plate thus maximize heat exchange surface of said heatsink.

* * * * *